(12) United States Patent
Desineni et al.

(10) Patent No.: US 7,870,519 B2
(45) Date of Patent: Jan. 11, 2011

(54) METHOD FOR DETERMINING FEATURES ASSOCIATED WITH FAILS OF INTEGRATED CIRCUITS

(75) Inventors: Rao H. Desineni, Poughkeepsie, NY (US); Maroun Kassab, St-Eustache (CA); Leah Marie Pfeifer Pastel, Essex, VT (US)

(73) Assignee: International Business Machines Corporation, Armonk, NY (US)

( * ) Notice: Subject to any disclaimer, the term of this patent is extended or adjusted under 35 U.S.C. 154(b) by 497 days.

(21) Appl. No.: 11/941,998

(22) Filed: Nov. 19, 2007

(65) Prior Publication Data
US 2009/0132976 A1 May 21, 2009

(51) Int. Cl.
G06F 17/50 (2006.01)
G01R 31/28 (2006.01)

(52) U.S. Cl. .............................. 716/4; 714/724; 714/736

(58) Field of Classification Search ...................... 716/4; 703/23; 714/724, 726, 729, 735, 738–739
See application file for complete search history.

(56) References Cited

U.S. PATENT DOCUMENTS

| | | | |
|---|---|---|---|
| 7,194,706 B2 * | 3/2007 | Adkisson et al. ............... | 716/4 |
| 2004/0025123 A1 * | 2/2004 | Angilivelil ...................... | 716/4 |
| 2005/0022085 A1 * | 1/2005 | Vo et al. ...................... | 714/738 |
| 2005/0081130 A1 * | 4/2005 | Rinderknecht et al. ....... | 714/726 |
| 2005/0229057 A1 * | 10/2005 | Anderson et al. ........... | 714/726 |
| 2007/0220384 A1 * | 9/2007 | Bartenstein et al. ......... | 714/726 |
| 2007/0260952 A1 * | 11/2007 | Devanathan et al. ........ | 714/726 |
| 2008/0077833 A1 * | 3/2008 | Motika et al. ............... | 714/726 |

* cited by examiner

*Primary Examiner*—Stacy A Whitmore
(74) *Attorney, Agent, or Firm*—Schmeiser, Olsen & Watts; Michael J. LeStrange

(57) ABSTRACT

A method for testing an integrated circuit and analyzing test data. The method includes: defining a set of signal path selection criteria; selecting a subset of signal paths of an integrated circuit design, the selecting signal paths meeting the selection criteria; identifying pattern observation points for each signal path of the subset of signal paths; selecting a set of features associated with the integrated circuit design; applying a set of test patterns to one or more integrated circuit chips; determining failing signal paths of the subset of signal paths for each integrated circuit chip; mapping failing signal paths of the subset of signal paths to the set of features to generate a correspondence between the failing signal paths and the features; and analyzing the correspondence and identifying suspect features of the set of features based on the analyzing.

29 Claims, 7 Drawing Sheets

METHOD FOR DETERMINING FEATURES ASSOCIATED WITH FAILS OF INTEGRATED CIRCUITS

FIELD OF THE INVENTION

The present invention relates to the field of integrated circuits; more specifically, it relates to methods of testing integrated circuits and of analyzing fails detected by the testing methods.

BACKGROUND OF THE INVENTION

In order to fabricate integrated circuits cost effectively, the yield of good integrated circuit chips must continually improve. Testing not only identifies defective or unreliable chips, but also provides failing chip data for analysis and root cause determination to make adjustments to chip design or fabrication process. Conventional failure analysis techniques are used to investigate root cause for specific failing chips. Failure analysis is a resource-intensive way to understand defect mechanisms and provide direction to design or manufacturing, often being expensive and time-consuming.

In addition, as technology, hardware, and software become more complex, new methods to better understand and quantify interactions between them and provide better integration are needed. These interactions pertain to yield and reliability, as well as efficient manufacturability and system operation.

Accordingly, there exists a need in the art to provide methods that efficiently lead to yield, reliability, manufacturability, functionality, and system operation improvements that overcome the deficiencies and limitations described hereinabove.

SUMMARY OF THE INVENTION

A first aspect of the present invention is a method, comprising: defining a set of signal path selection criteria; selecting a subset of signal paths of an integrated circuit design from a set of signal paths of the integrated circuit design, the selecting the subset of signal paths based on the signal paths meeting the selection criteria; identifying pattern observation points for each signal path of the subset of signal paths; selecting a set of features associated with the integrated circuit design; applying a set of test patterns that test the subset of signal paths to one or more integrated circuit chips, the integrated circuit chips fabricated to the integrated circuit design; determining failing signal paths of the subset of signal paths for each integrated circuit chip of the one or more integrated circuit chips; mapping failing signal paths of the subset of signal paths to the set of features to generate a correspondence between the failing signal paths and the features; and analyzing the correspondence and identifying suspect features of the set of features based on the analyzing.

A second aspect of the present invention is a method, comprising: (a) defining a set of signal path selection criteria; (b) selecting a subset of signal paths of an integrated circuit design from a set of signal paths of the integrated circuit design, the selecting the subset of signal paths based on the signal paths meeting the selection criteria; (c) selecting a set of features associated with the integrated circuit design; (d) identifying pattern observation points for each signal path of the subset of signal paths; (e) determining features associated with each subset path; (f) applying a set of test patterns that test the subset of signal paths to one or more integrated circuit chips, the integrated circuit chips fabricated to the integrated circuit design; (g) determining failing signal paths of the subset of signal paths for each integrated circuit chip of the one or more integrated circuit chips; (h) mapping failing signal paths of the subset of signal paths to the set of features to generate a correspondence between the failing signal paths and the features; (i) analyzing the correspondence and identifying suspect features of the set of features based on the analyzing; (j) changing the set of subset paths; and (k) repeating steps (a) through (j) until a changed set of subset paths meets user-defined criteria for suspect feature detection.

A third aspect of the present invention is a computer system comprising a processor, an address/data bus coupled to the processor, and a computer-readable memory unit coupled to communicate with the processor, the memory unit containing instructions that when executed by the processor implement a method for testing an integrated circuit, the method comprising the computer implemented steps of: storing a set of user-defined selection criteria; selecting a subset of signal paths of an integrated circuit design from a set of signal paths of the integrated circuit design, the selecting the subset of signal paths based on the signal paths meeting the selection criteria; identifying pattern observation points for each signal path of the subset of signal paths; storing a set of user-selected features associated with the integrated circuit design; applying a set of test patterns that test the subset of signal paths to one or more integrated circuit chips, the integrated circuit chips fabricated to the integrated circuit design; determining failing signal paths of the subset of signal paths for each integrated circuit chip of the one or more integrated circuit chips; mapping failing signal paths of the subset of signal paths to the set of features to generate a correspondence between the failing signal paths and the user-selected features; and analyzing the correspondence and identifying suspect features of the set of features based on the analyzing.

BRIEF DESCRIPTION OF THE DRAWINGS

The features of the invention are set forth in the appended claims. The invention itself, however, will be best understood by reference to the following detailed descriptions of illustrative embodiments when read in conjunction with the accompanying drawings, wherein:

DETAILED DESCRIPTION OF THE INVENTION

Figure 1:
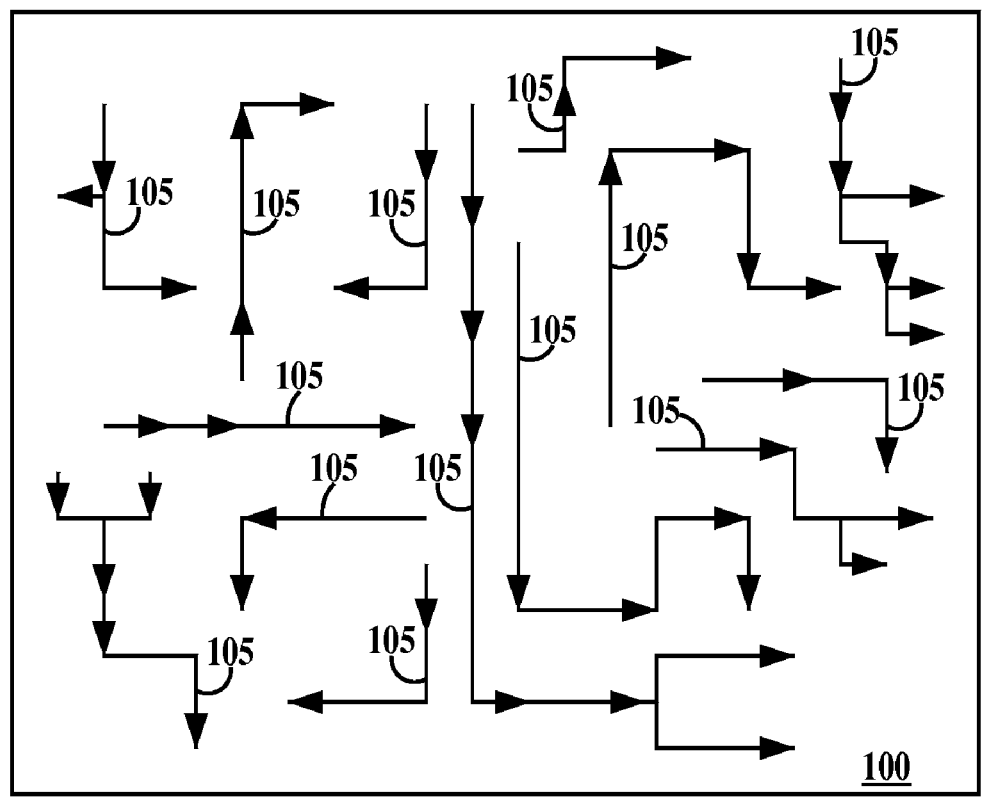
FIG. 1 is a schematic representation of an integrated circuit chip illustrating the many different paths that exist.

FIG. 1 is a schematic representation of an integrated circuit chip illustrating the many different signal paths that exist. In FIG. 1, an integrated circuit chip 100 includes a multiplicity of signal paths 105 (hereinafter paths). A path has at least one pattern input point connected by the path to at least one observation point. In general, test patterns include, not only the test vectors (a pattern of zeros and ones) themselves, but also the expected pattern (again a vector of zeros and ones) for a good circuit as well as the timings and voltage levels to be applied during the test. For the purposes of describing the present invention, the term integrated circuit chip will include any devices containing integrated circuits. Additionally, for the purposes of describing the present invention, the term test pattern will be used in the narrow sense of the test vector itself unless otherwise noted. Test patterns are designed to find particular fail mechanisms that may be modeled by a particular fault type. Test patterns are also designed to activate or exercise paths in order to capture specific data from the integrated circuit or measure a particular behavior or performance. Examples of fault types include, stuck at one or stuck at zero faults, bridge faults (which model defects that create an unwanted connection between two paths), and pattern faults (which model complex behaviors). When a test pattern is applied to pattern input points, a resultant pattern is created as the test pattern propagates along the path and through circuit elements in the path, the resultant pattern being observed at the observation points. In one example, paths trace the connections between multiple circuit elements in a block of logic that performs a function. In paths 105, wires are represented by lines and circuit elements by arrows, which also show the direction of signal propagation. While unidirectional paths are illustrated in FIG. 1, the embodiments of the present invention are applicable to bi-directional paths and tri-state buses as well.

Figure 2:
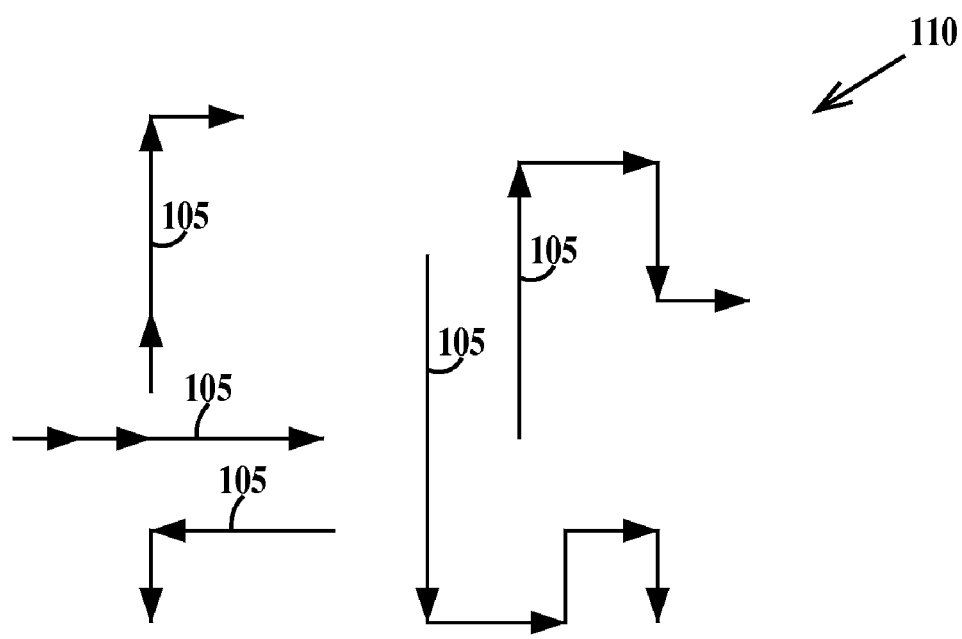
FIG. 2 is a schematic representation of a subset of the paths of FIG. 1 selected according to the present invention.

FIG. 2 is a schematic representation of a subset of the paths of FIG. 1 selected according to the present invention. In FIG. 2, a subset 110 includes a selected set of the paths of FIG. 1. Selection of the specific paths 105 to be included in subset 110 is discussed infra.

By proper selection of the subset paths, the embodiments of the present invention provide means to identify suspect features without depending on physical failure analysis. Features are defined infra. A suspect feature is a feature that is statistically related to particular test fails. A wide range of analysis objectives may be accommodated by properly selecting the path subset, including yield, reliability, manufacturability, functionality, and system operation objectives. Diagnostic simulation can be reduced or eliminated by appropriate selection of the subset. A list of suspect features may be fed back to design and/or manufacturing and process to indicate adjustment of the design, data prep, and/or fabrication process to eliminate or reduce yield loss. Information about suspect features may also be fed back to test, diagnostics, and failure analysis for further isolation and investigation of the root cause fail mechanisms. Diagnostics and fault isolation resource may be targeted to specific fails with suspect features.

Figure 3:
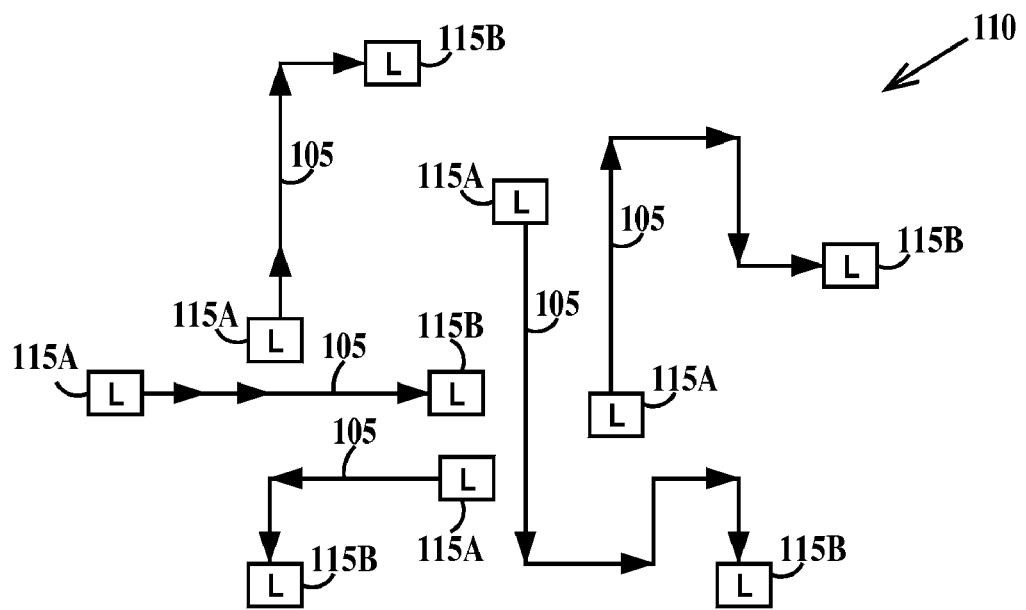
FIG. 3 is a schematic representation of the subset of the paths of FIG. 2 after identification of pattern input and pattern observation points according to the present invention.

FIG. 3 is a schematic representation of the subset of the paths of FIG. 2 after identification of pattern observation points according to the present invention. In FIG. 3, pattern input points 115A and pattern observation points 115B are depicted. Pattern input points 115A are points in the design where test pattern inputs may be applied (such as chip I/Os, scan chain I/Os and scan chain latches). Pattern input points 115A may also include analog signal or energy stimulus points (such as suitable for laser, heat or light stimuli). Pattern observation points 115A may also include points accessible by analog or energy output or observation points (such as voltage or current or magnetic field measurements or photon or thermal or light energy capture or waveform acquisition). Test patterns are applied to paths 105 from outside of integrated circuit chip 100 (see FIG. 1). Pattern observation points 115B are points in the design where the resultant patterns may be observed (such as chip I/Os, scan chain I/Os and scan chain latches). Test pattern results are measured for paths 105 at pattern observation points 115B. Pattern input points 115A and pattern observation points 115B may be internal or external to the chip being tested. Determination of pattern input points 115A and pattern observation points and 115B is discussed infra.

Figure 4:
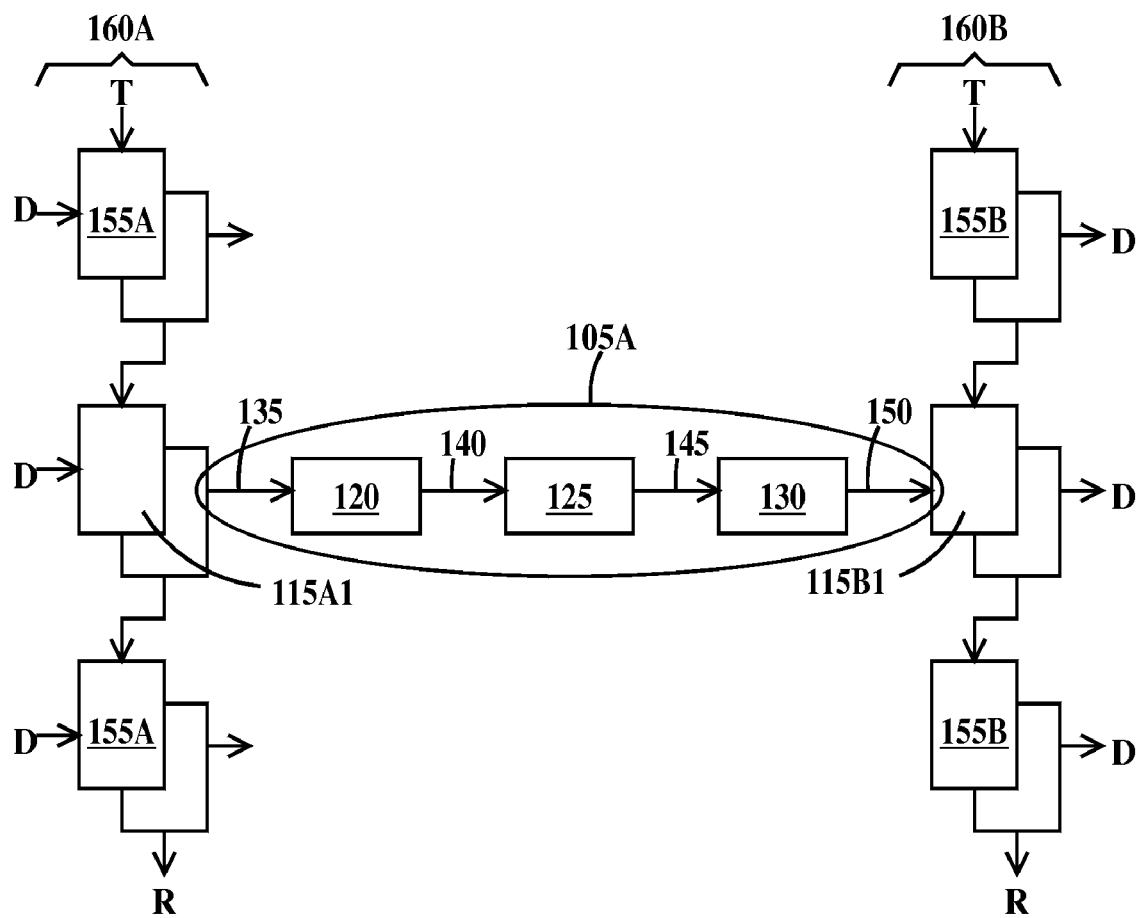
FIG. 4 is a circuit diagram of an exemplary subset signal path and its relationship to exemplary peripheral circuits.

FIG. 4 is a circuit diagram of an exemplary subset signal path and its relationship to exemplary peripheral circuits. In FIG. 4, a signal path 105A includes circuit elements 120, 125 and 130 and wires 135, 140, 145 and 150. Wire 135 connects pattern input point 115A1 to circuit element 120, wire 140 connects circuit element 120 to circuit element 125, wire 145 connects circuit element 125 to circuit element 130, wire 150 connects circuit element 130 to pattern observation point 115B1. Wires 135, 140, 145 and 150 include not only wires but also vias connecting wires in different wiring levels (integrated circuit chips generally have multiple wiring levels). There are also wires and vias internal to the circuit elements 120, 125 and 130. It should be noted that signal path 105A is a single fan-in, single fan-out signal path, in that there is only one pattern input point 115A1 and one pattern observation point 115B1. In some cases, the pattern input point may fan-out to the next circuit on the scan path, as well as the functional single fan-out. In one embodiment of the present invention, the subset selection criterion is that all paths in the subset be single fan-in, single fan-out paths.

In the example of FIG. 4, pattern input point 115A1 is a latch in a scan-in chain 160A and pattern observation point 115B1 is a latch in scan-out chain 160B. Other latches in scan chain 160A are designated 155A and other latches in scan chain 160B are designated 155B. In one embodiment of the invention, scanable latches are components of scan chains and are designed to meet the requirements of level sensitive scan design (LSSD) logic, which allows structural testing of chip logic via scan chain loads and unloads. Failing pattern, scan chain, and latch information can be collected for failing test patterns.

Before proceeding, the concept of a netlist needs to be discussed. In general, a netlist is simply a list of elements and connections. There are several types of netlists of interest. A design netlist may define the design in terms of circuit models, logical models, functions, and behaviors. A test netlist is a netlist used specifically for testing the integrated circuit design or the physical integrated circuit chip; it may be used to generate test patterns, simulate good machine behavior, or diagnose faulty behavior. A geometric netlist (also called a shapes file) describes the design in terms of geometric shapes. The geometric netlist is used to make photomasks for the various fabrication levels of an integrated circuit.

Figure 5:
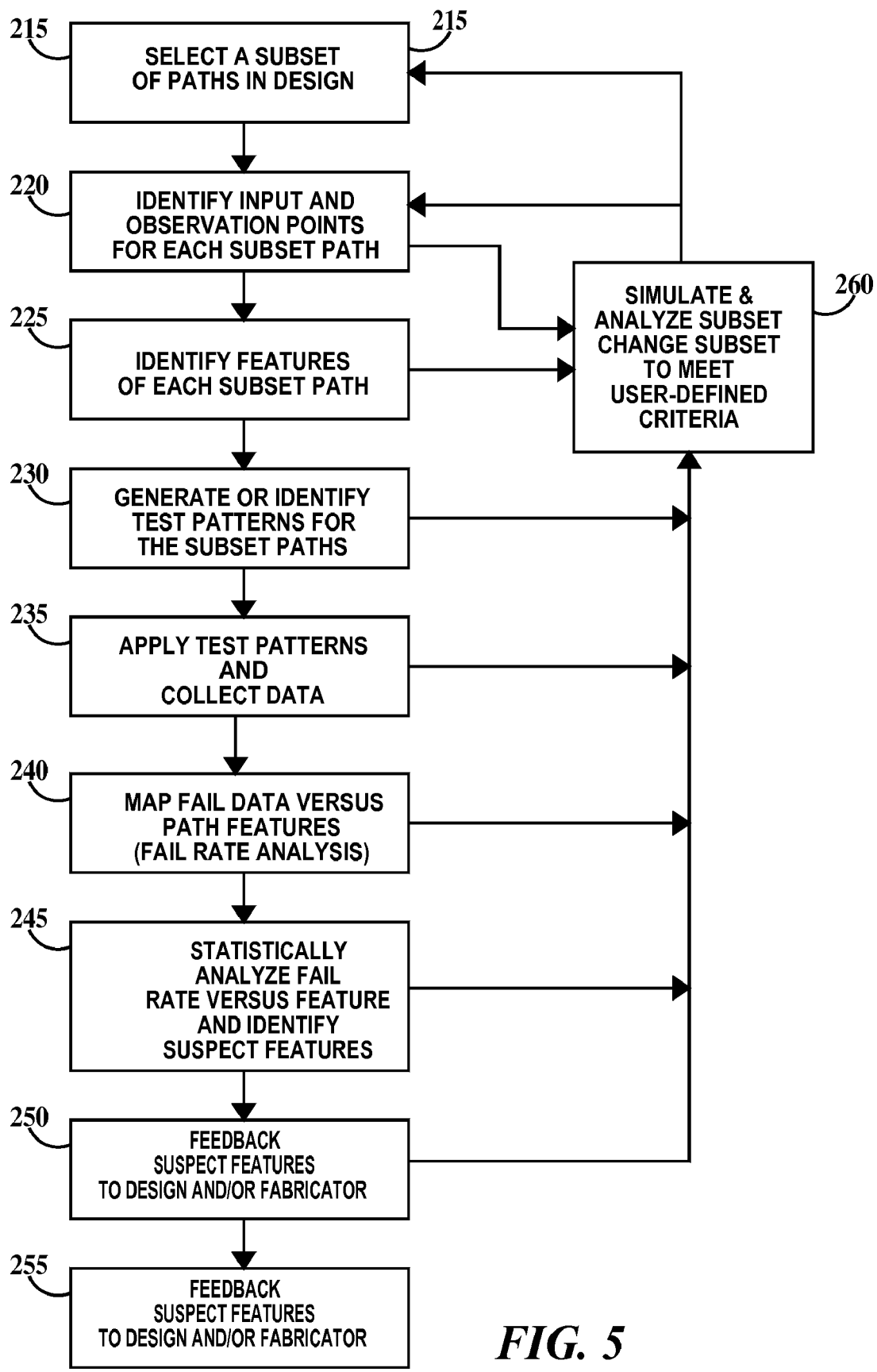
FIG. 5 is a flow diagram illustrating the method of the present invention.

FIG. 5 is a flow diagram illustrating the method of the present invention. In step 215, the subset of paths is selected from all the paths in the integrated circuit chip design by applying a set of criteria to the integrated circuit chip design. Paths in the subset may be complete paths (e.g., from an I/O to and I/O or from one scan latch to another scan latch) or portions of paths (e.g., from an internal point in the design to a scan latch). The term path is intended to cover both unless otherwise noted. The subset may be selected using any netlist representation, such as a design netlist, a test netlist or a shapes file and suitable software. Examples of signal path selection criteria include, but are not limited to: (i) only single fan-in, single fan-out paths; single fan-in having a specified number of fan-outs or up to a specified number of fan-outs; paths having single observation points, (ii) paths with specific activations, such as pattern dependent paths, mux selectable paths or paths in particular clock domains, (iii) paths associated with specific functions, (iv) paths with specific behaviors, such as performance, delay, current, (v) paths that are accessible using physical properties measurable by, for example, fault isolation techniques such as photoemission spectroscopy (PEM), picosecond imaging circuit analysis (PICA), laser scanning microscopy (LSM), or special test equipment or methodology, (vi) paths having a specified number of vias; paths having a specified length of wiring; paths having wires with specified widths, (vii) paths having specified circuit elements (e.g. logic functions, gates, transistor types), (viii) paths having specified areas, (ix) paths in specified regions of the chip, (x) paths in specified power supply voltage regimes; paths having transistors of specified threshold voltage or design type, (xi) paths having specific layout patterns and (xii) paths having specific physical design environment (such as adjacent wiring), structure, feature or defect sensitivity. The criteria may be applied to the netlist using a software program. Additional information may be used to apply a specific criteria (such as timing or performance information). In one embodiment, paths that meet the specified criteria for single fan-in, single fan-out paths are selected using a back-cone tracing tool and a test netlist. Specifically, functional parts of the paths are traced, while ignoring scan only parts of the paths.

In step 220, pattern observation points for each of the subset paths are identified. For single fan-in, single fan-out paths, pattern observation points are latches in scan chains and there is a one to one correspondence between a path and its pattern observation point. No diagnostic simulation of the paths is required to determine the failing path(s) on failing chips. One of ordinary skill in the art would be able to adapt the practice of the present invention to multi-fan-out and/or multi-fan-in paths as well as to use other criteria using specially adapted software.

Depending on the selection criteria, pattern observation point to feature mapping may be a function of the test pattern or a function of multiple observation points.

In step 225, the features of interest for the paths of the subset are identified and a table of path index versus feature values each path is constructed. Table I is an example of a Path Feature Table.

Features may be quantitative features, geometric features or parametric features. Examples of quantitative features include, but are not limited to, the length and layer content of wires in the path, the number of vias in the path, number of particular structures or shapes or particular types of circuit elements associated with the path (defined supra). Geometric features include, but are not limited to, wires crossing over other lower level wires, spacing between wires in the path, wires having a certain number of direction changes, and spacing between path wires and other wires or fill shapes or level content. Parametric features include, but are not limited to, transistor threshold voltages, operating voltage levels, clock domains, timing, voltage, or current values or performance. Feature values may indicate presence or absence of a feature or may be a qualitative value, such as low, med, high or good, bad, unknown. Features may be quantified absolutely, relatively, normalized, scaled, weighted, as appropriate to the analysis in step 245 (discussed infra) and interpretation in step 250 (discussed infra).

Figure 6:
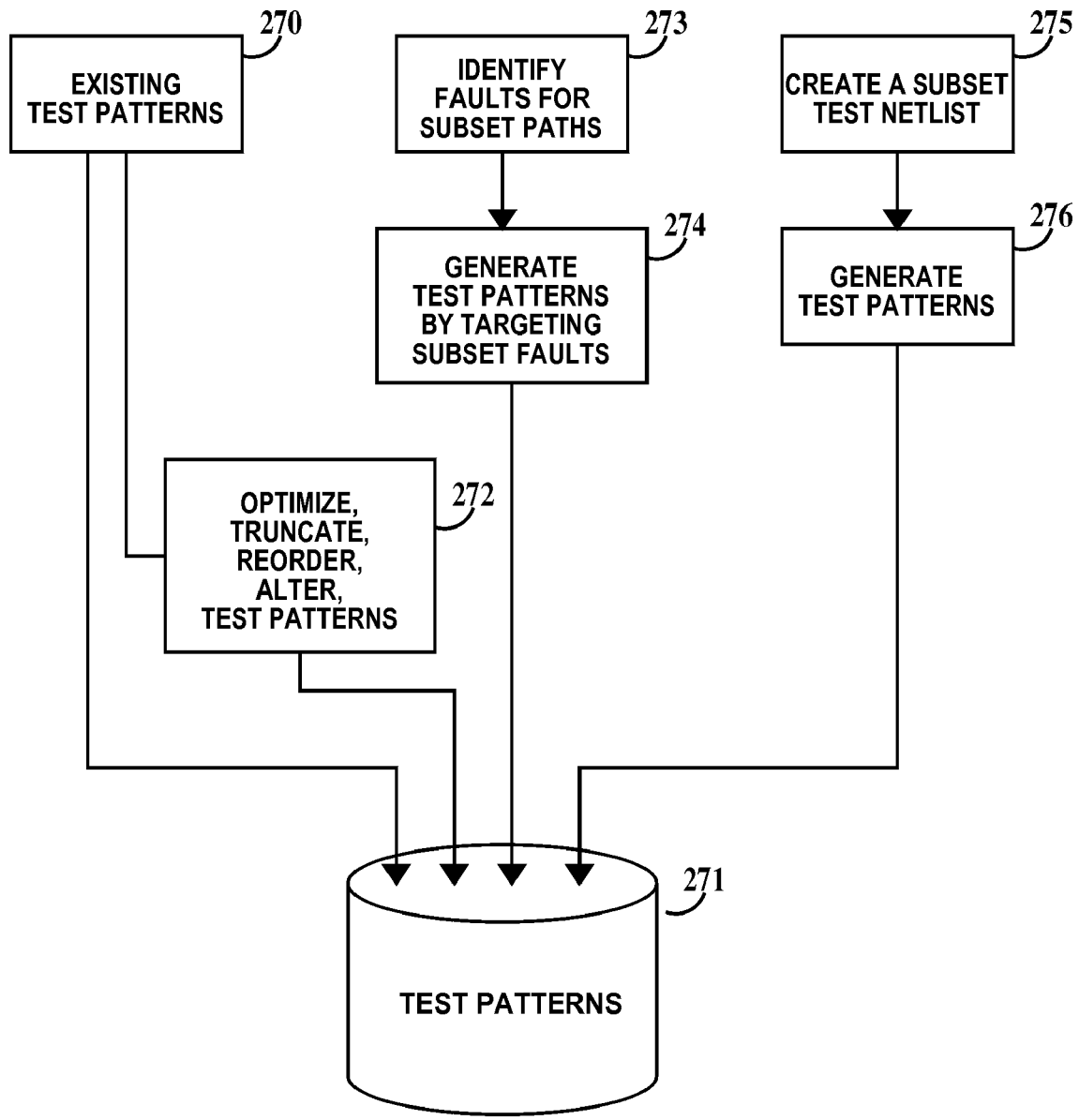
FIG. 6 is a flow diagram illustrating three methods of generating a test pattern set according to the present invention.

In step 230, test patterns to test the subset are created, generated, or identified (see FIG. 6 for more details). Test patterns may include existing patterns, patterns generated without knowledge of the subset, patterns generated targeting the subset, patterns optimized for the subset and subsequent analysis. The test pattern set may be made up of a combination of patterns. While it is advantageous for the same type of fault testing to be performed on different paths or sub-paths of a path, it is possible to use different fault types on different paths or sub-paths of a path. During test, not all patterns in the test pattern set may be applied to any particular integrated circuit chip. Testing may stop before all test patterns have been applied due to other constraints, such as test time or data collection limits. This may affect the completeness of the fail data and the accuracy of the subsequent analysis.

In step 235, test patterns are applied and test data is collected. A resultant pattern is part of the test data generated. In one embodiment, the fail data includes the test measurement values.

In step 240, the fail data is mapped to the features for each fail on each integrated circuit chip. In one embodiment, fail data may be mapped to features for each chip. In another embodiment, a fail rate for each observation point may be determined and mapped to corresponding features. Table II is an example of a Chip Fails to Features Map for a single fan-in, single fan-out path subset.

TABLE I

| Path Index | Feature 1 | Feature 2 | Feature 2 | Feature 4 | Feature 5 | Feature 6 | ... | Feature m-1 | Feature m |
|---|---|---|---|---|---|---|---|---|---|
| 1 | 10 | 0 | 0 | 0 | 2 | 0 | | 200 | 0 |
| 2 | 4 | 20 | 0 | 0 | 2 | 1 | | 4100 | 1 |
| 3 | 8 | 4 | 30 | 100 | 1 | 1 | | 124 | 3 |
| 4 | 100 | 8 | 20 | 5000 | 0 | 1 | | 4000 | 1 |
| 5 | 100 | 400 | 0 | 0 | 0 | 1 | | 200 | 1 |
| 6 | 4 | 20 | 500 | 10K | 2 | 1 | | 5000 | 4 |
| 7 | 100 | 5000 | 5000 | 0 | 0 | 1 | | 0 | 8 |
| ... | | | | | | | | | |
| n | 25 | 200 | 5000 | 0 | 0 | 1 | | 450 | 3 |

TABLE II

| Chip | Observation point | Path Index | Feature 1 | Feature 2 | Feature 3 | Feature 4 | Feature 5 | ... | Feature m-1 | Feature m |
|---|---|---|---|---|---|---|---|---|---|---|
| 101 | B-5 | 4 | 100 | 8 | 20 | 500 | 0 | | 4000 | 1 |
| 102 | D-17 | 16 | 4 | 20 | 49 | 10K | 2 | | 5000 | 4 |
| 103 | Q-17 | 6 | 4 | 20 | 500 | 10K | 2 | | 5000 | 4 |
| 104 | Z-5 | 4 | 100 | 8 | 20 | 300 | 0 | | 4000 | 1 |
| 105 | Q-57 | 3 | 8 | 4 | 30 | 100 | 1 | | 125 | 3 |
| 106 | A-2 | 1 | 10 | 0 | 0 | 0 | 2 | | 200 | 0 |
| 107 | Q-17 | 6 | 4 | 20 | 500 | 10K | 2 | | 5000 | 4 |
| 108 | E-15 | 5 | 100 | 400 | 0 | 0 | 0 | | 3500 | 1 |
| 109 | E-27 | 310 | 10 | 8 | 0 | 0 | 4 | | 4500 | 0 |
| 110 | Q-24 | 117 | 4 | 100 | 200 | 0 | 2 | | 4000 | 1 |
| 111 | B-7 | 21 | 32 | 4 | 31 | 400 | 1 | | 4000 | 1 |
| ... | | | | | | | | | | |
| K | D-7 | 2 | 4 | 20 | 0 | 0 | | | 4100 | 1 |

In Table II, only one fail per integrated circuit chip is shown but there could be multiple fails for each integrated circuit chip (e.g. multiple rows per chip). Each failing observation point is described by failing scan out pin (letter designation) and the scan-out bit (numerical designation). The path index and the features are from Table I. For example, chips 103 and 107 both fail at Q-17 (path 6) with the quantification for the features on path 6 illustrated in Table II. In other embodiments, mapping fail data to path features may require additional information suitable to the subset. For example, failing pattern numbers or timing predictions or measurements. Depending on the subset complexity, the test data and observation points may be mapped to the subset with a dictionary or fault simulation.

In step 245, a statistical analysis is performed on the fail and feature data. In one embodiment, the information in Table II is analyzed. In another embodiment the fail rate and feature data may be analyzed. Passing data may be included in the analysis, as well as other pertinent data, such as logistical data or process related or design change or correspondence data. Fail counts or rates or yields may be normalized, scaled or weighted as part of the analysis. Examples of statistical analysis include partial least squares and principle component analysis. For example, returning to Table II, statistical analysis found that feature m-1 is a key characteristic of failing chips.

In step 250, the analysis results from step 245 are used to identify suspect features. Suspect features are features that fail statistically different than expected or predicted. Suspect features can include features that have a higher fail rate than other features or fail more often than would be expected in a random set of fails. Features that fail less often than expected may also be identified.

In step 255, the list of suspect features is fed back to chip design and/or manufacturing to indicate adjustment of the design and/or fabrication process to eliminate or reduce the frequency of the fail. Information about suspect features may also be fed back to test, diagnostics, and failure analysis for further isolation and investigation of the root cause fail mechanism.

It should be noted that steps 215, 220, 225, 230 and 260 are performed on design level data, including netlist representations of the design and test patterns. Step 235 is performed on physical hardware by a tester under computer control. Steps 240, 245, and optionally 250 are performed by software running on a computer. Step 250 may also be performed manually by a user interpreting results from step 250.

Optionally, steps 220, 225, 230, 235, 240, 245, and 250 may feedback to the optional step 260. In step 260, the subset is changed or adapted based on feedback generated from other steps of the invention. For example, feedback from step 225 based on feature distribution and coverage may indicate additional paths should be added with specific feature content. Feedback from steps 220, 230, 235, 240, 245, and 250 may be based on test coverage, design element coverage, fault coverage, defect type coverage, feature coverage and distribution, yield, fail counts or fail rate, sample sizes, analysis results, suspect feature.

Changes to the subset may optionally be made to enhance suspect feature detection during steps 240, 245 and 250. Optional step 260 may be used to adapt the subset by updating the subset criteria used to select the subset in step 215, or by changing the subset in step 220. For example, during optional step 260, the test pattern set may be simulated using a simulation model or netlist representing the design to identify which faults may be observed at the subset observation points. If insufficient defect type or fault coverage is determined, additional faults may be identified and mapped to paths that could be added to the subset. Observation points may be translated to feature distribution and coverage or design element coverage, and the subset altered by adding or removing certain paths from the subset. For example, if a feature X in all paths has the same value, then additional paths must be found to provide discrimination for feature X or the analysis described infra will be distorted. Adding paths requires looping back to step 220 for paths that are added. Step 260 may be performed on simulated fail data or hardware fail data. All steps may be performed multiple times until the change criteria are met. For example, step 260 may be repeated until feature distribution and coverage meets the requirements of the statistical analysis in step 245. In another example, the subset may continue to be enlarged, until sufficient fail data is generated over available hardware to meet statistical analysis requirements in step 245.

In FIG. 5, steps 220, 225, 230, 235 and 240 are shown in a particular order. However, depending on the particular embodiment steps 220, 225, 230, 235 and 240 may be performed in another order or in parallel. For example the steps may be performed in the order 220, 230, 235, 225 and 240.

FIG. 6 is a flow diagram illustrating three methods of generating a test pattern set according to the present invention. Method 1: In step 270 existing test patterns are used in step 235 of FIG. 5, becoming test patterns 271. When existing patterns are used, an additional step 280 illustrated in FIG. 7 and described infra may be required. In one example, existing test patterns used in step 270 are generated for testing the entire integrated circuit (or a section thereof). In another example, existing test patterns 270 are generated during a previous step 230, 274 or 276. Alternatively, in step 272, the existing test patterns 270 are altered by optimizing for the subset, reordering, truncating, or changing expects or measures. For example, expected values may be removed or masked for non-subset pattern observation points and this altered pattern set becomes test patterns 271. Method 2: In step 273, possible faults are identified for the paths of the subset. In step 274, test patterns that target the faults identified in step 273 are generated. This new set of test patterns becomes test patterns in step 271. Method 3: In step 275, a subset test netlist from the test netlist for the entire integrated circuit (or section thereof) is created and in step 276, test patterns are generated using the subset netlist. This new set of test patterns becomes test patterns in step 271.

Figure 7:
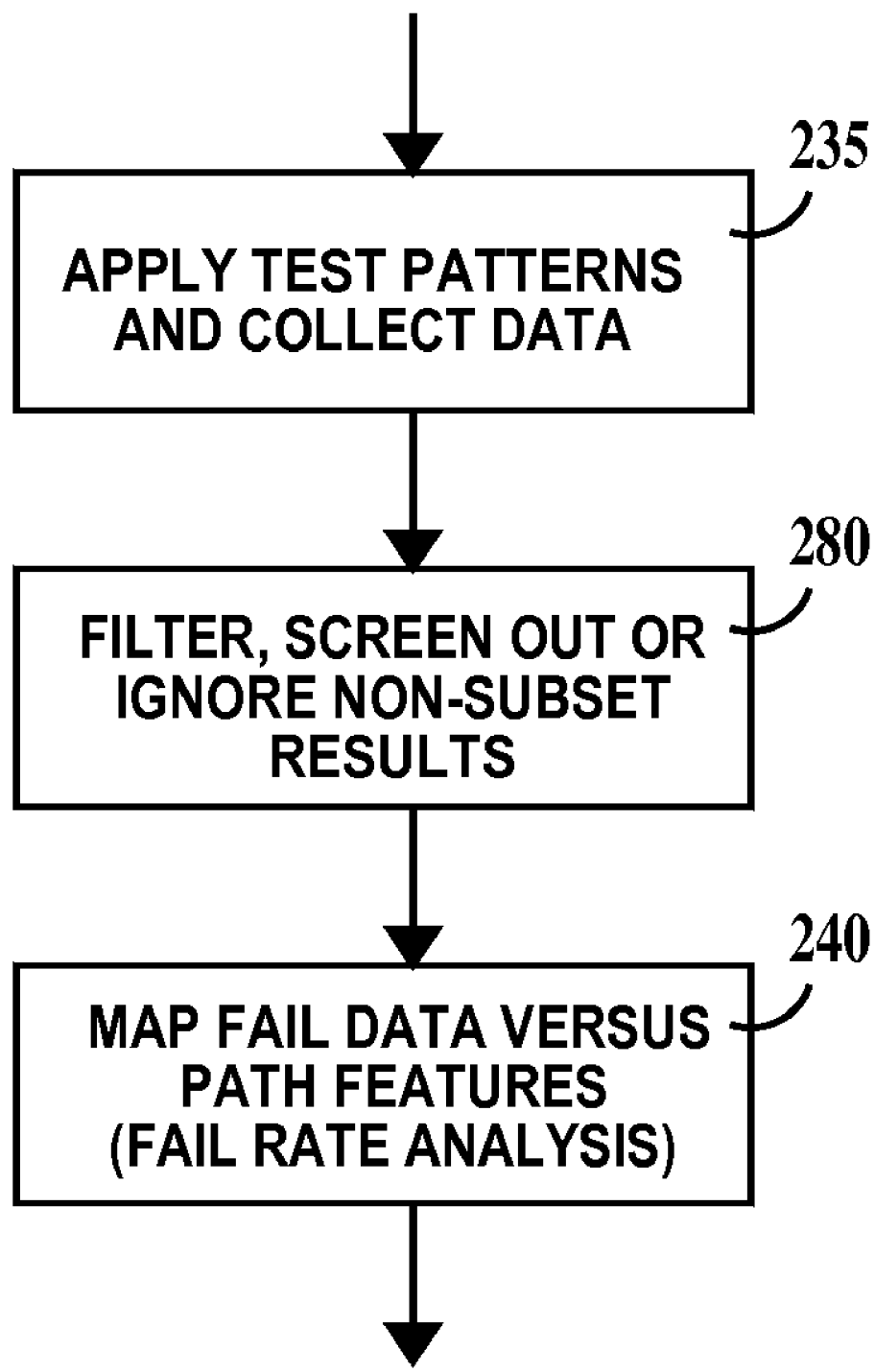
FIG. 7 is a flow diagram illustrating an additional and optional data processing step, when existing patterns are used as the test pattern set.

FIG. 7 is a flow diagram illustrating an additional and optional data processing step, when existing patterns are used as the test pattern set (see step 270 in FIG. 6). Step 280 is inserted between steps 235 and 240 when test patterns 271 are generated in step 270 of FIG. 6. In step 280, test results and fail data collected in step 235 for non-subset observation points are filtered or screened out prior to step 240 (mapping fails to features) or are ignored in step 240. Step 280 may be used to adapt to subset changes without changing test patterns.

In summary, for method 1, existing test patterns are applied to multiple integrated circuit chips, and resulting data for paths within the subset are used for subset analysis. Data for paths outside of the subset are ignored, filtered out, or not collected. Alternatively, for method 1, existing test patterns are filtered and/or optimized or otherwise modified before being applied, which may result in a smaller set of test patterns than the original set. The patterns are applied to multiple integrated circuit chips and resulting data for paths within the subset are used for subset analysis. If paths outside the subset are observed, resulting data for paths outside of the subset is ignored, filtered out, or not collected. If the expected vector portion of the test pattern (in the general sense) is modified to only contain vectors for subset paths, then the test data will only contain results for subset paths. Either method 1 or alternative method 1 has the advantage of not requiring a special set of test patterns. In an embodiment, the existing test patterns may be the entire set of test patterns developed from the test netlist (or section thereof). Alternative method 1 has the additional advantage of improved test time using the new pattern set, due to applying fewer patterns and making fewer measurements (if some expects have been masked).

In summary, for method 2, possible faults for subset paths are identified in the test netlist. Test patterns are generated by targeting these faults. Method 2 has the advantage of creating a small set of test patterns, which should run quickly and not require any manipulation of the resulting test data. The compactness of the test pattern set is dependent on the subset criterion.

In summary, for method 3, a new subset test netlist is generated for testing the paths of the subset. Method 3 has the advantages of being able to be run very quickly because of the reduced number of test patterns, not needing to screen the resultant patterns and because adjustments may be easily made to the test pattern set. Also if the subset paths are complex, the subset netlist could be used to transform the observation points to the corresponding subset path. This method requires a new subset test netlist to be created for each considered subset, and there is a certain amount of non-subset circuitry that must be included in the netlist in order to exercise the subset paths (such as clocking circuitry).

Figure 8:
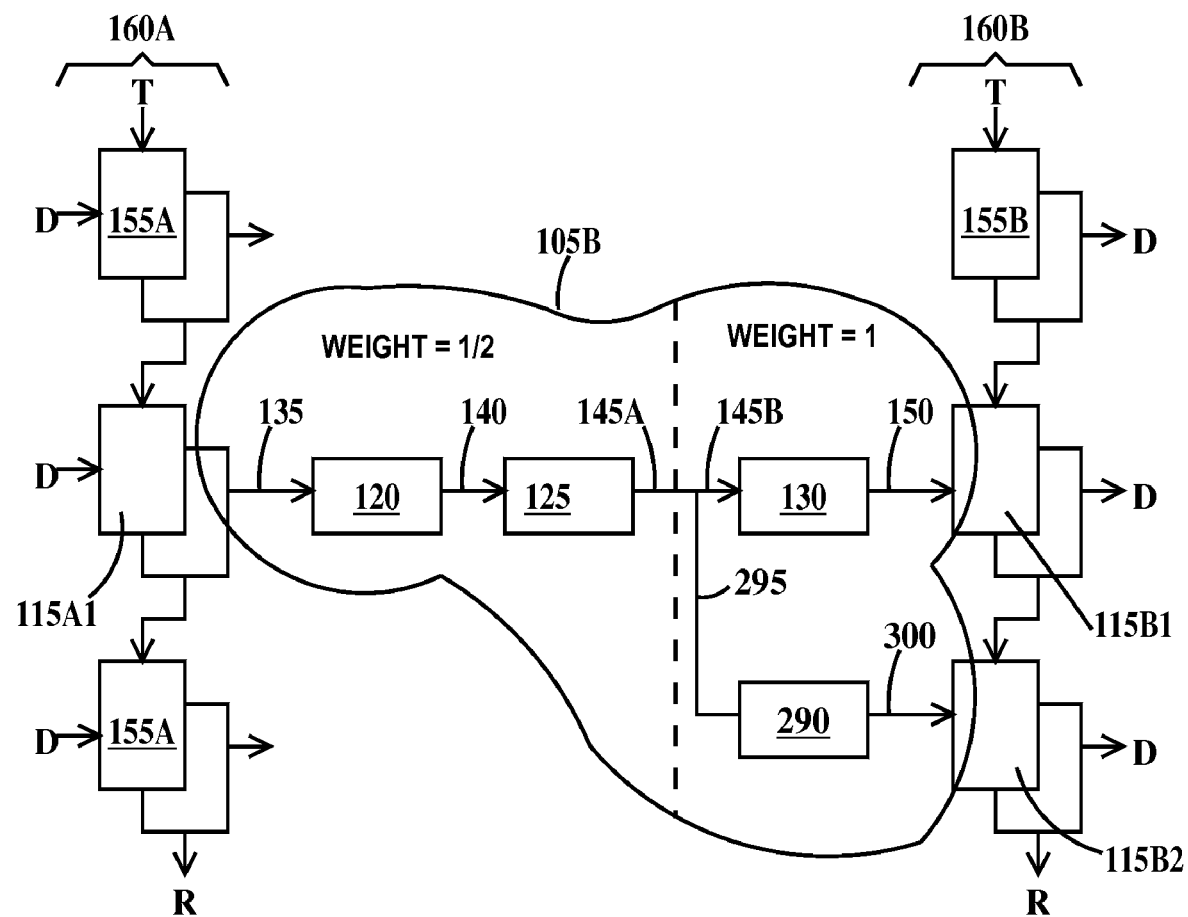
FIG. 8 is a circuit diagram of an exemplary multiple-path subset signal path and its relationship to exemplary peripheral circuits.

FIG. 8 is a circuit diagram of an exemplary multiple-path subset signal path and its relationship to exemplary peripheral circuits. In FIG. 8, a path 105B is similar to path 105A of FIG. 4, with the exception of circuit element 290, wires 295 and 300, and pattern observation point 115B2. Wire 145 of FIG. 4 has been split into two parts, 145A and 145B at node A where wires 145A, 145B and 295 connect. Wire 295 connects node A to circuit element 290 and wire 300 connects circuit element 290 to pattern observation point 115B2. In one embodiment with a subset that contains multi-path subset signal paths, test results are mapped using combinations of observation points. For example, path 105B in FIG. 8 might be mapped to three partial paths based on whether observation points 115B1 and 115B2 both observe a fail or only one of the two observation points fail. When both 115B1 and 115B2 fail, the chip fail is mapped to features associated with wires 135, 140, 145A, 145B, 295 and circuits 120, 125. When only 115B1 fails, the chip fail is mapped to features associated with wires 145B, 150 and circuit 130. When only 115B2 fails, the chip fail is mapped to features associated with wires 295, 300 and circuit 290. In another embodiment, multi-path subset signal paths are handled by weighting features associated with an observation point. Since path 105B is a single fan-in, two fan-out path, when it is tested, fails can be observed at observation points 115B1 and 115B2. Observe point 115B1 observes fails on the path wire 135, element 120, wire 140, wire 145A, wire 145B, element 130 and wire 150. Observe point 115B2 observes the path wire 135, element 120, wire 140, element 125, wire 145A, wire 295, element 290 and wire 300. Both observe points, 115B1 and 115B2, observe subpath wire 135, element 120, wire 140, wire 145A. To compensate for this, features associated with wire 135, element 120, wire 140, and wire 145A are given a statistical weight of ½, whereas wire 145B, element 130, wire 150, wire 295, element 290 and wire 300 are given a weight of 1. These feature weights may be used to calculate feature values that are taken into account during statistical analysis. For example, if wire 140 was defected and caused a fail that is observed by both 115B1 and 115B2, wire 140 content would be counted twice with a weight of ½, and so counted once. Similar weighting may be performed to allow inclusion of multiple fan-out paths in the subset without distorting the analysis of the fail data.

Figure 9:
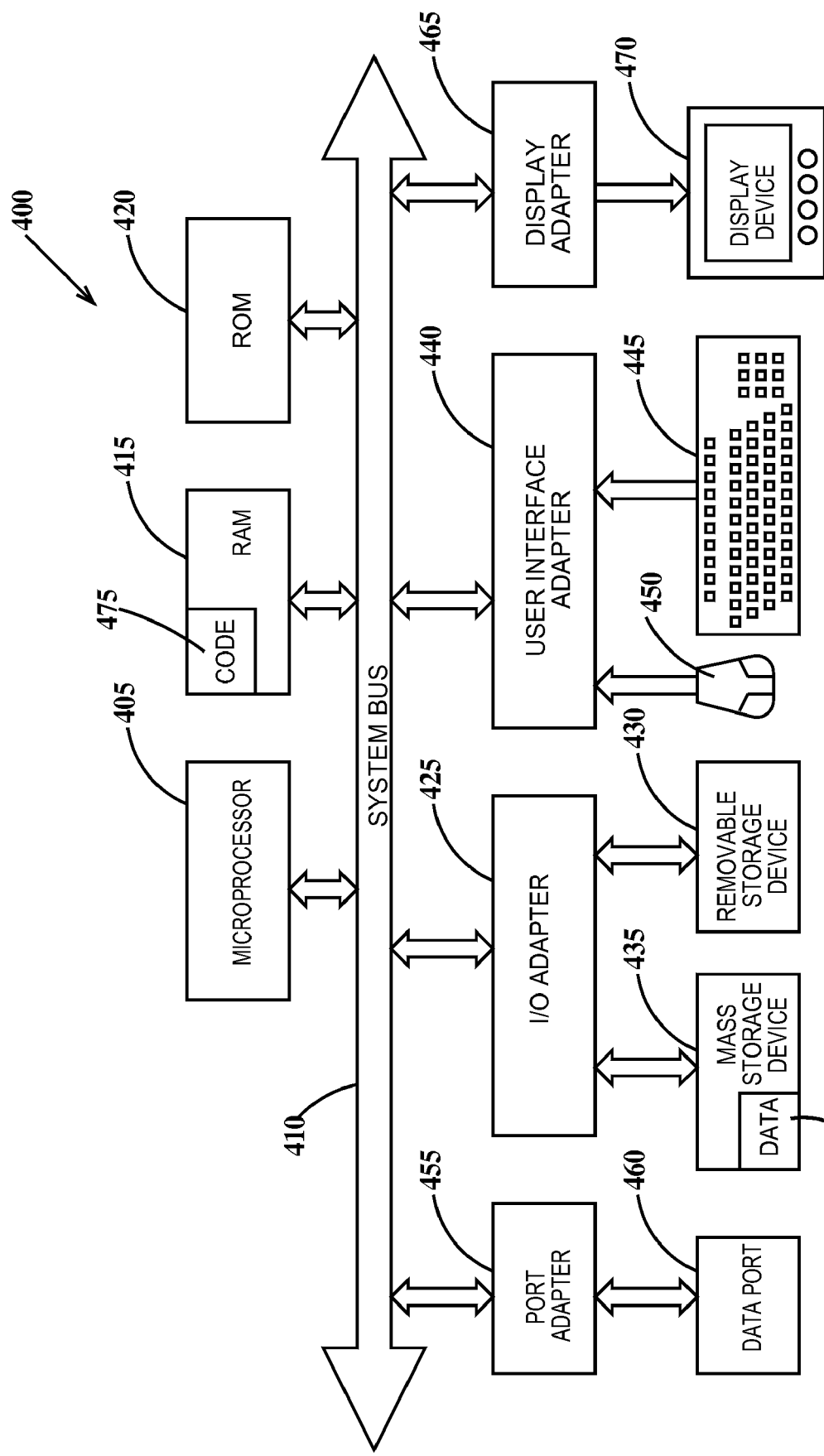
FIG. 9 is a schematic block diagram of a general-purpose computer for practicing the embodiments of the present invention.

FIG. 9 is a schematic block diagram of a general-purpose computer for practicing the embodiments of the present invention. In FIG. 9, computer system 400 has at least one microprocessor or central processing unit (CPU) 405. CPU 405 is interconnected via a system bus 410 to a dynamic random access memory (DRAM) device 415 and a read-only memory (ROM) device 420, an input/output (I/O) adapter 425 for a connecting a removable data and/or program storage device 430 and a mass data and/or program storage device 435, a user interface adapter 440 for connecting a keyboard 445 and a mouse 450, a port adapter 455 for connecting a data port 460 and a display adapter 465 for connecting a display device 470.

Either devices 415 and 420 contains the basic operating system for computer system 400. Removable data and/or program storage device 430 may be a magnetic media such as a floppy drive, a tape drive or a removable hard disk drive or optical media such as CD ROM or a erasable/writeable CD or a digital video disc (DVD) or solid state memory such as ROM or DRAM or flash memory. Mass data and/or program storage device 435 may be a hard disk drive or an optical drive or a networked data storage system. In addition to keyboard 445 and mouse 450, other user input devices such as trackballs, writing tablets, pressure pads, microphones, light pens and position-sensing screen displays may be connected to user interface 440. Examples of display devices include cathode-ray tubes (CRT) and liquid crystal displays (LCD).

One of devices 415, 420, 430 or 435 includes computer code 475 (illustrated by way of example in device 415), which is a computer program that comprises computer-executable instructions. Computer code 475 includes an algorithm for generating subset test patterns (e.g. the algorithm of FIGS. 6) and for analyzing resultant data generated by applying the test patterns to integrated circuit chips (e.g. the algorithm of FIG. 6). CPU 405 executes computer code 475. Any of devices 415, 420, 430 or 435 may include input data 480 (illustrated by way of example in device 435) required by computer code 475. Display device 470 displays output from computer code 475.

Any or all of devices 415, 420, 430 and 435 (or one or more additional memory devices not shown in FIG. 9) may be used as a computer usable medium (or a computer readable medium or a program storage device) having a computer readable program embodied therein and/or having other data stored therein, wherein the computer readable program comprises computer code 475.

Thus the present invention discloses a process for supporting computer infrastructure, integrating, hosting, maintaining, and deploying computer-readable code into the computer system 400, wherein the code in combination with the computer system 400 is capable of performing a method for generating subset test patterns and for analyzing resultant test data generated by applying the test patterns to integrated circuit chips.

Thus the present invention provides a method of testing and failure data analysis that overcomes the deficiencies and limitations described hereinabove.

The description of the embodiments of the present invention is given above for understanding present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
defining a set of signal path selection criteria;
selecting a subset of signal paths that meet said selection criteria from a set of signal paths of an integrated circuit design;
identifying pattern observation points for each signal path of said subset of signal paths;
selecting a set of two or more features associated with signal paths of said integrated circuit design;
for each signal path of said subset of signal paths, assigning a respective value to each feature of said set of features;
applying a same set of test patterns that test said subset of signal paths to two or more integrated circuit chips, each integrated circuit chip of said two or more integrated circuit chips fabricated to said integrated circuit design, until at least two of said two or more integrated circuit chips fail;
determining the failing signal paths of said subset of signal paths for each failing integrated circuit chip of said two or more integrated circuit chips;
for each failing integrated circuit chip, mapping the failing signal paths and the observation point at which the failing signal paths were detected to corresponding features of said set of features to generate a fail table containing the failing paths of all said failing integrated circuit chips; and
performing a statistical analysis of said fail table to determine suspect features that are characteristic of all said failing integrated circuit chips.

2. The method of claim 1, further including:
selecting said set of test patterns from a larger set of test patterns or generating said set of test patterns for each signal path of said subset of signal paths.

3. The method of claim 2, wherein said generating said set of test patterns includes:
identifying faults for each signal path of said subset of signal paths and generating a test pattern set to test said faults.

4. The method of claim 1, further including:
changing said integrated circuit design based on said suspect features.

5. The method of claim 1, further including:
changing a fabrication process of said integrated circuit chips based on said suspect features.

6. The method of claim 1, wherein each pattern observation point of said pattern observation points are independently selected from the group consisting of latches in scan chains, chip I/Os and scan chain I/Os.

7. The method of claim 1, wherein each signal path of said subset of signal paths comprises elements independently selected from the group consisting of wires, vias connecting wires resistors, capacitors, inductors, diodes, transistors, logic gates, complex combinations of logic gates and combinations thereof.

8. The method of claim 1, wherein said selection criteria comprise selecting only paths having a single fan-in and a single fan-out.

9. The method of claim 1, wherein said selection criteria comprise selecting only paths with single observation points.

10. The method of claim 1, wherein predicted timing of signals through said signal paths is compared to actual timing of said signals through said signal paths to differentiate between said failing and passing signal paths of said integrated circuit chips.

11. The method of claim 1, wherein said features are selected from the group consisting of quantitative features, geometric features and parametric features.

12. The method of claim 1, wherein said generating said set of test patterns includes:
selecting a subset of a test netlist to signal paths of said subset of signal paths from said test netlist corresponding to signal paths of said integrated circuit design and generating test patterns corresponding to said subset of said test netlist.

13. The method of claim 1, wherein said selecting said subset of signal paths comprises selecting signal paths from a design netlist, a test netlist or a shapes file.

14. The method of claim 1, when said selection criteria comprise selecting signal paths having a single fan-in and a multiple fan-out, further including:
for each multiple fan-out signal path, (i) applying weights to features observed by more than one observation point or (ii) using combinations of observation points to identify failing paths.

15. The method of claim 1, wherein said value for each feature of said set of features is a number of times said feature occurs in a respective signal subpath.

16. The method of claim 1, wherein said value for each feature of said set of features is a type of physical feature in a respective signal subpath.

17. The method of claim 1, wherein said value for each feature of said set of features is an electrical parametric value associated with a respective signal subpath.

18. The method of claim 1, wherein all signal paths of said subset of signal paths do not include all features of said set of features.

19. A method of claim 1, comprising:
defining a set of signal path selection criteria;
selecting a subset of signal paths of an integrated circuit design from a set of signal paths of said integrated circuit design, said selecting said subset of signal paths based on said signal paths meeting said selection criteria;
identifying pattern observation points for each signal path of said subset of signal paths;
selecting a set of features associated with said integrated circuit design;
applying a set of test patterns that test said subset of signal paths to one or more integrated circuit chips, said integrated circuit chips fabricated to said integrated circuit design;
determining failing signal paths of said subset of signal paths for each integrated circuit chip of said one or more integrated circuit chips;
mapping failing signal paths of said subset of signal paths to said set of features to generate a correspondence between said failing signal paths and said features;
analyzing said correspondence and identifying suspect features of said set of features based on said analyzing;
wherein, when said selection criteria comprise selecting signal paths having a single fan-in and a multiple fan-out, for each multiple fan-out signal path, (i) applying weights to features observed by more than one observation point or (ii) using combinations of observation points to identify failing paths.

20. A method, comprising:
(a) defining a set of signal path selection criteria;
(b) selecting a subset of signal paths that meet said selection criteria from a set of signal paths of an integrated circuit design;
(c) selecting a set of two or more features associated with signal paths of said integrated circuit design;
(d) identifying pattern observation points for each signal path of said subset of signal paths;
(e) for each signal path of said subset of signal paths, assigning a respective value to each feature of said set of features;
after (a) through (e), (f) applying a same set of test patterns that test said subset of signal paths to two or more integrated circuit chips, each integrated circuit chip of said two or more integrated circuit chips fabricated to said integrated circuit design, until at least two of said two or more integrated circuit chips fail;
after (f), (g) determining the failing signal paths of said subset of signal paths for each failing integrated circuit chip of said multiple integrated circuit chips;
after (f), (h) for each failing integrated circuit chip, mapping the failing signal paths and the observation point at which the failing signal paths were detected to corresponding features of said set of features to generate a fail table containing the failing paths of all said failing integrated circuit chips;
after (h), (i) performing a statistical analysis of said fail table to determine suspect features that are characteristic of all of said failing integrated circuit chips;
after (i), (j) changing the set of subset paths; and
after (j), (k) repeating steps (f) through (j) until a changed set of subset paths meets user-defined criteria for suspect feature detection.

21. The method of claim 20, wherein said changing said set of subset paths is based on analyzing the distribution and coverage of features associated with said subset paths.

22. The method of claim 20, wherein said changing said set of subset paths includes removing signal paths from said subset of signal paths or adding signal paths to the subset of signal paths.

23. The method of claim 20, wherein said changing said set of subset paths is based on feature fail rates of subset paths.

24. The method of claim 20, wherein said mapping said failing signal path includes mapping failing signal paths from combinations of observation points.

25. The method of claim 20, wherein said value for each feature of said set of features is a number of times said feature occurs in a respective signal subpath.

26. The method of claim 20, wherein said value for each feature of said set of features is a type of physical feature in a respective signal subpath.

27. The method of claim 20, wherein said value for each feature of said set of features is an electrical parametric value associated with a respective signal subpath.

28. The method of claim 20, wherein all signal paths of said subset of signal paths do not include all features of said set of features.

29. A computer system comprising a processor, an address/data bus coupled to said processor, and a computer-readable memory unit coupled to communicate with said processor, said memory unit containing instructions that when executed by the processor implement a method for testing an integrated circuit, said method comprising the computer implemented steps of:
storing a set of user-defined signal path selection criteria;
selecting a subset of signal paths that meet said selection criteria from a set of signal paths of an integrated circuit design;
identifying pattern observation points for each signal path of said subset of signal paths;
storing a set of two or more user-selected features associated with signal paths of said integrated circuit design;
for each signal path of said subset of signal paths, assigning a respective value to each feature of said set of features;
applying a same set of test patterns that test said subset of signal paths to two or more integrated circuit chips, each integrated circuit chip of said two or more integrated circuit chips fabricated to said integrated circuit design, until at least two of said two or more integrated circuit chips fail;
determining the failing signal paths of said subset of signal paths for each failing integrated circuit chip of said two or more integrated circuit chips;
for each failing integrated circuit chip, mapping the failing signal paths and the observation point at which the failing signal paths were detected to corresponding features of said set of features to generate a fail table containing the failing paths of all said failing integrated circuit chips; and
performing a statistical analysis of said fail table to determine suspect features that are characteristic of all of said failing integrated circuit chips.

* * * * *